United States Patent
Fan et al.

(10) Patent No.: US 7,723,828 B2
(45) Date of Patent: May 25, 2010

(54) SEMICONDUCTOR PACKAGE WITH LEADS ON A CHIP HAVING MULTI-ROW OF BONDING PADS

(75) Inventors: Wen-Jeng Fan, Hsinchu (TW); Yu-Mei Hsu, Hsinchu (TW)

(73) Assignee: Powertech Technology Inc., Hsinchu (TW)

( * ) Notice: Subject to any disclaimer, the term of this patent is extended or adjusted under 35 U.S.C. 154(b) by 169 days.

(21) Appl. No.: 12/068,613

(22) Filed: Feb. 8, 2008

(65) Prior Publication Data

US 2009/0160038 A1    Jun. 25, 2009

(51) Int. Cl.
*H01L 23/495*    (2006.01)

(52) U.S. Cl. .............................. 257/670; 257/E23.048
(58) Field of Classification Search ............ 257/670, 257/E23.048
See application file for complete search history.

(56) References Cited

U.S. PATENT DOCUMENTS 5,229,639 A * 7/1993 Hansen et al. ............ 257/666
7,504,714 B2 * 3/2009 Shen ........................... 257/667

* cited by examiner

*Primary Examiner*—Sue Purvis
*Assistant Examiner*—Krista Soderholm
(74) *Attorney, Agent, or Firm*—Muncy, Geissler, Olds & Lowe, PLLC

(57) ABSTRACT

A LOC leadframe-based semiconductor package includes a chip with multiple rows of bonding pads. At least a bus bar is attached to the chip and is disposed between a first row of bonding pads and the fingers of the leads. A plurality of bonding wires electrically connect the first row of bonding pads to the fingers of the leads. The portion of the bus bar attached to the active surface of the chip includes a bent section bent away from the fingers. A long bonding wire electrically connects one of a second row of bonding pads to one of the fingers of the leads by overpassing the bent section. Therefore, the distance between the long bonding wire and the bus bar is increased to avoid electrical short between the long bonding wire and the bus bar and to enhance the quality of electrical connections of the LOC semiconductor package.

8 Claims, 5 Drawing Sheets

SEMICONDUCTOR PACKAGE WITH LEADS ON A CHIP HAVING MULTI-ROW OF BONDING PADS

FIELD OF THE INVENTION

The present invention relates to semiconductor devices, especially to LOC (Lead-On-Chip) leadframe-based semiconductor packages for chips with multiple rows of bonding pads.

BACKGROUND OF THE INVENTION

A LOC (Lead-On-Chip) package is one kind of semiconductor packages by attaching the leads of a leadframe directly to the active surface of a chip without using die pads of a leadframe under the chip so that the length of the bonding wires from the bonding pads of the chip to the fingers of a leadframe can greatly be reduced leading to higher operation frequencies with lower packaging costs.

As shown in FIG. 1 and FIG. 2, a conventional semiconductor package 100 primarily comprises a chip 110, a plurality of first leads 120 and a plurality of second leads 150 of a leadframe, a plurality of bonding wires 141, 142, and 144. The chip 110 has an active surface 111 with a plurality of bonding pads 112 disposed in a single row on the active surface 111. The first leads 120 and the second leads 150 are extended from both corresponding sides of the semiconductor package 100 onto the active surface 111 of the chip 110. The first leads 120 and the second leads 150 are attached to the active surface 111 of the chip 110 by a die-attaching material 160 where the internal leads of the first leads 120 and the internal leads of the second leads 150 inside an encapsulant 170 include a plurality of first fingers 121 and the second fingers 151 for bonding the bonding wires 141 and 142, as shown in FIG. 2. The leadframe further has one or more bus bars 130 attached to the active surface 111 of the chip 110 disposed between the center bonding pads 112 and the fingers 121 of the first leads 120 or/and between the center bonding pads 112 and the fingers 151 of the second leads 150. Normally the bus bars 130 are configured for power or ground connections. As shown in FIG. 2, the bonding wires 141 and 142 have one ends bonded to the center bonding pads 112 of the chip 110 and overpass the bus bar 130 so that the other ends of the bonding wires 141 and 142 are bonded to the first fingers 121 of the first leads 120 and to the second fingers 151 of the second leads 150 respectively to make electrical connections between the chip 110 and the leadframe. At least one bonding wire 144 connects one pad 112A of the center bonding pads 112 to the bus bar 130, which has a shorter length than the one of the bonding wires 141 and 142. The encapsulant 170 encapsulates the chip 110, the internal leads of the leads 120 and 150, the bonding wires 141, 142, and 144. However, due to higher I/O density and miniature of a chip, arranging the center bonding pads in a row will be gradually replaced by multiple rows such as two rows of bonding pads.

Currently, chips with multiple rows of bonding pads packaging into LOC semiconductor packages have lower packaging yields due to different lengths of bonding wires from multiple rows of bonding pads to fingers at one side, especially the lengths of the bonding wires from a farther row of bonding pads overpassing the bus bar to the corresponding fingers become longer leading to lower yields resulting in difficulty in wire-bonding. Moreover, the longer bonding wires will suffer wire sweep during molding with electrical short to the bus bar leading to poor qualities of electrical connections.

SUMMARY OF THE INVENTION

The main purpose of the present invention is to provide a LOC leadframe-based semiconductor package with leads on a chip having multi-row of bonding pads to avoid electrical short between longer bonding wires and overpass bus bar due to wire sweep during molding to achieve higher packaging yields and productivity.

According to the present invention, a LOC leadframe-based semiconductor package primarily comprises a chip, a plurality of first leads and a plurality of second leads of a leadframe, at least a bus bar, a plurality of first bonding wires, and at least a long bonding wire. The chip has an active surface with a first row of bonding pads and a second row of bonding pads disposed on the active surface. Each first lead has a corresponding first finger. The first leads are attached to the active surface of the chip in a manner that the first finger is located above the active surface of the chip and adjacent to the first row of bonding pads. The bus bar is also attached to the active surface of the chip between the first row of bonding pads and the first fingers where the attached portion of the bus bar attached to the chip has a bent section bent away from the first fingers. The long bonding wire electrically connects one of the second row of bonding pads to one of the first fingers by overpassing the bent section of the bus bar.

DETAIL DESCRIPTION OF THE INVENTION

Please refer to the attached drawings, the present invention will be described by means of embodiment below.

Figure 1:
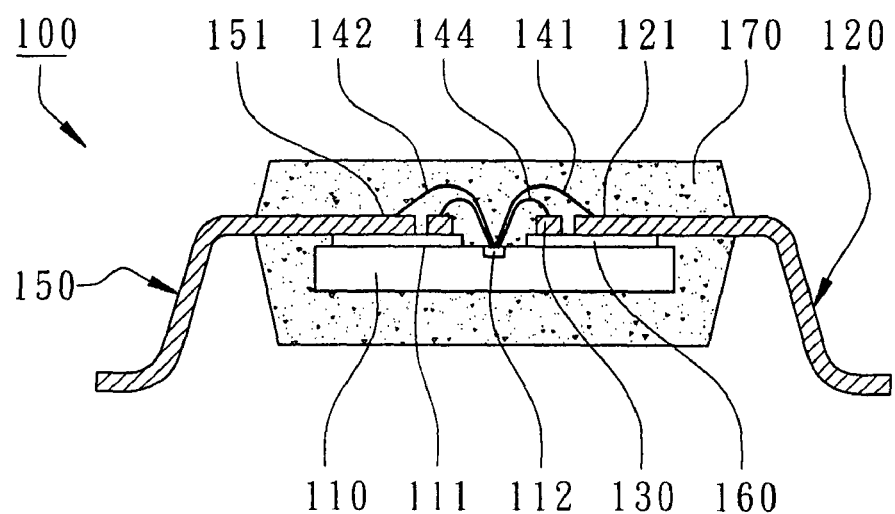
FIG. 1 shows a cross-sectional view of a conventional LOC semiconductor package.
Figure 2:
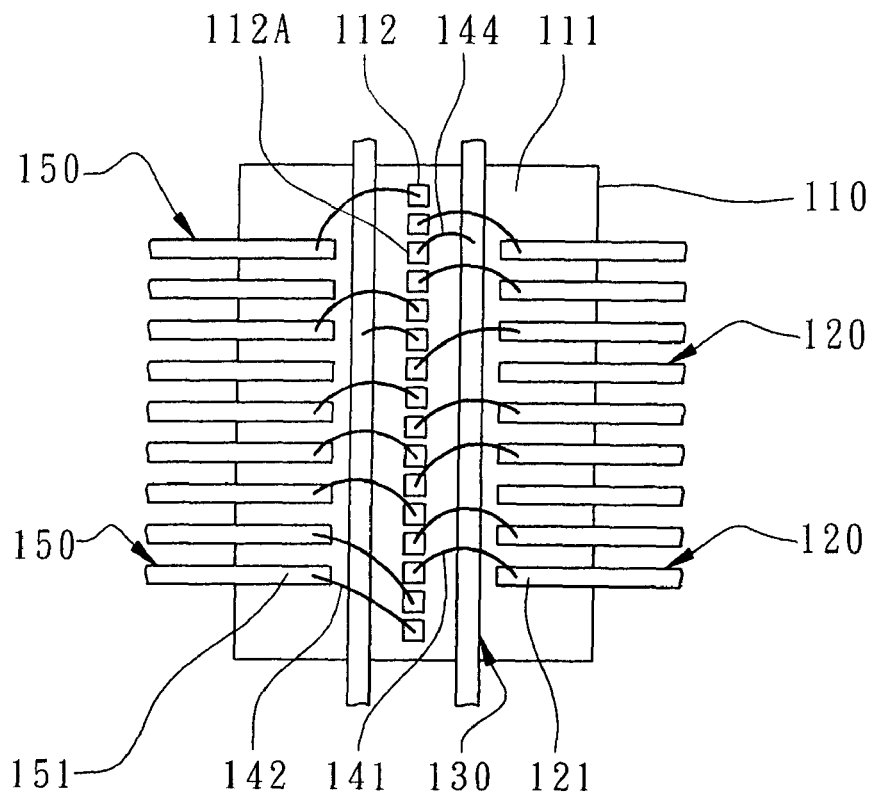
FIG. 2 shows the active surface of a chip of the conventional LOC semiconductor package before molding.
Figure 3:
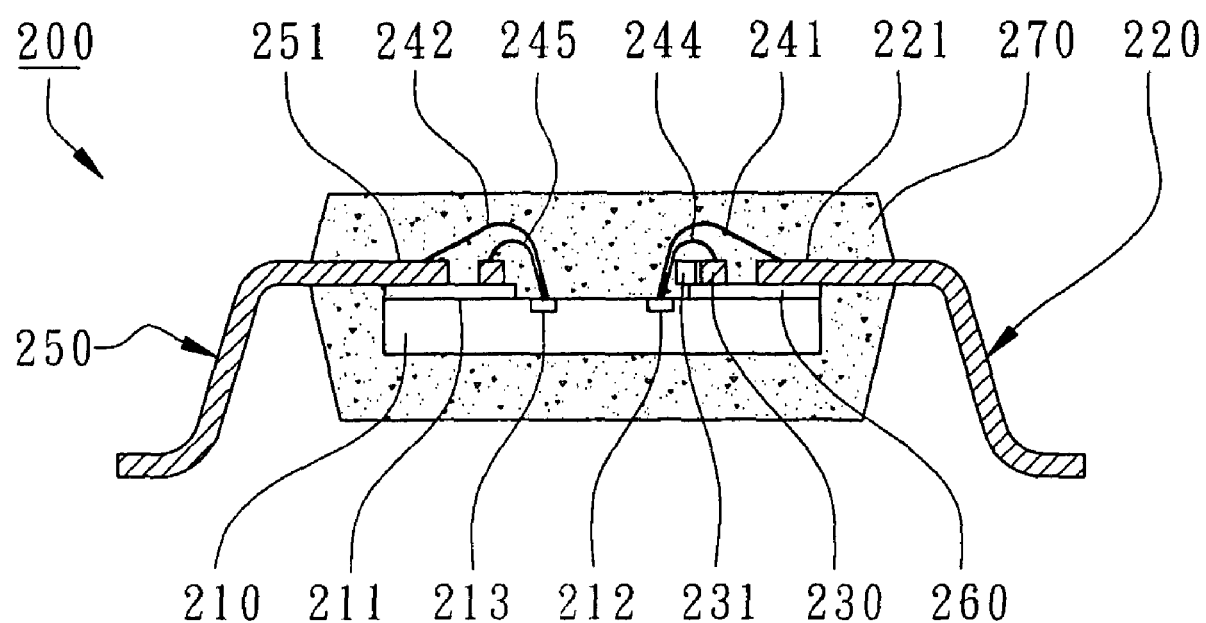
FIG. 3 shows the cross-sectional view of a LOC leadframe-based semiconductor package according to the preferred embodiment of the present invention.
Figure 4:
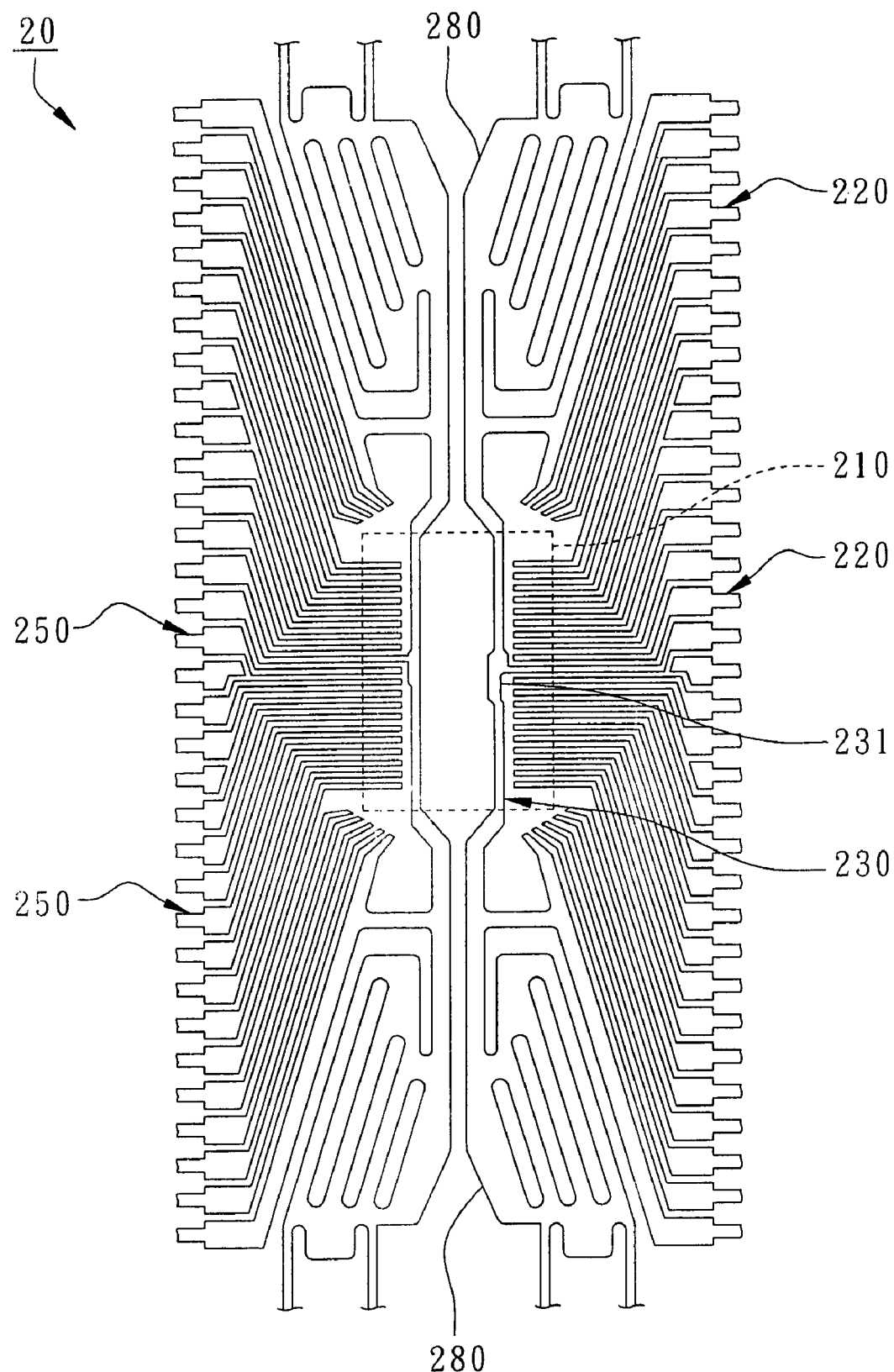
FIG. 4 shows the partial top view of a leadframe for the semiconductor package according to the preferred embodiment of the present invention.
Figure 5:
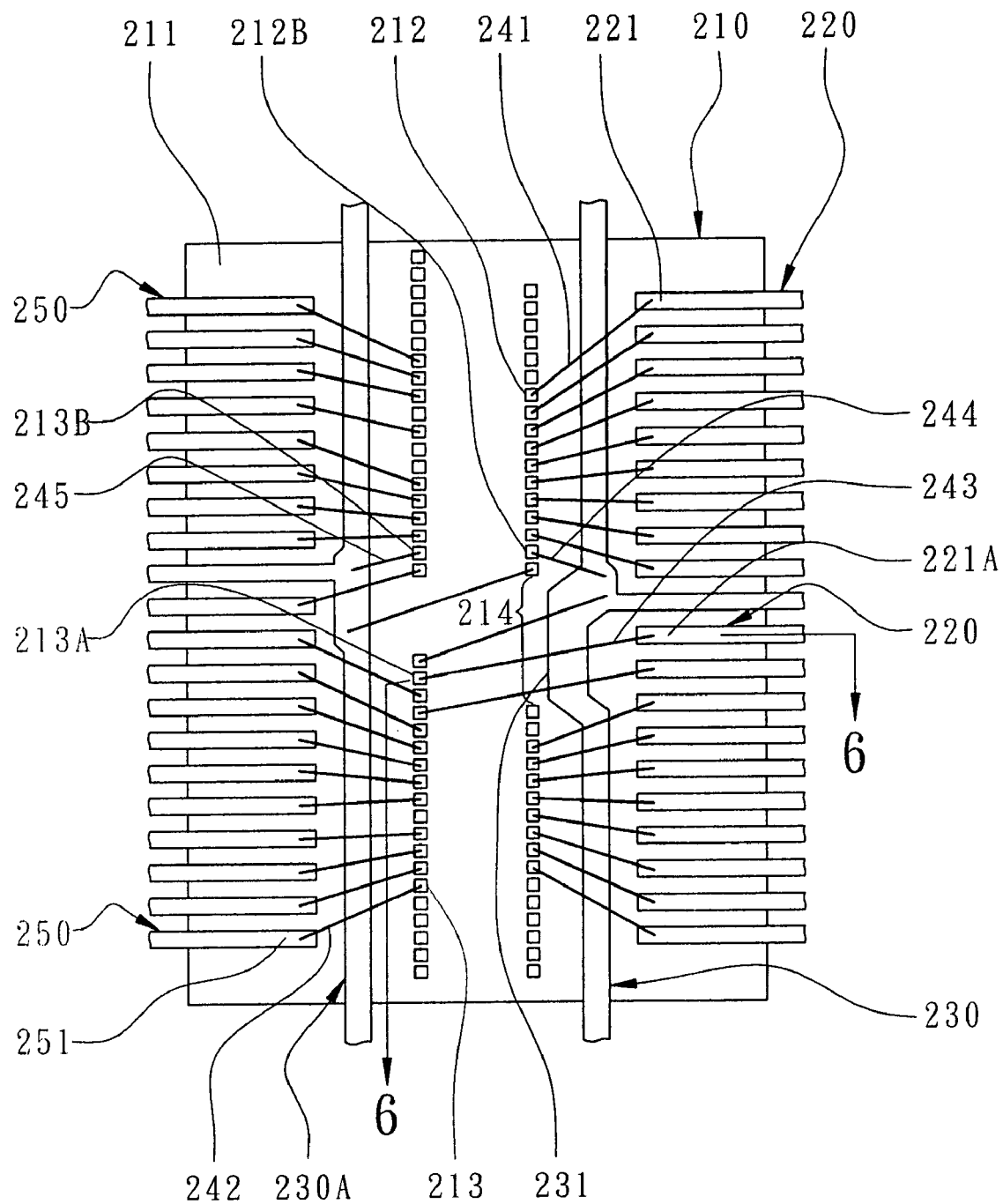
FIG. 5 shows the enlarged active surface of a chip of the semiconductor package before molding according to the preferred embodiment of the present invention.

As shown in FIG. 3 and FIG. 4, a semiconductor package 200 primarily comprises a chip 210, a plurality of first leads 220, at least a bus bar 230, a plurality of first bonding wires 241, and at least a long bonding wire 243. Therein, the first leads 220 and the bus bar 230 are parts of a leadframe 20. The chip 210 has an active surface 211 with a first row of bonding pads 212 and a plurality of second bonding pads 213 as electric terminals of the chip 210. The first row of bonding pads 212 and the second row of the bonding pads 213 are disposed in parallel along a center line on the active surface 211 of the chip 210 with equal distances to the center line. In this embodiment, as shown in FIG. 3, the external leads of the first leads 220 located outside the encapsulant 270 are disposed at the same side of the semiconductor package 200. As shown in FIG. 5, the internal leads of the first leads 220 encapsulated by the encapsulant 270 are extended onto the active surface 211 of the chip 210 from the same side.

As shown in FIG. 3, FIG. 4, and FIG. 5, each first lead 220 has a first finger 221. The first leads 220 are attached to the active surface 211 of the chip 210 in a manner that the first fingers 221 are located above the active surface 211 adjacent to the first row of bonding pads 212 for easily wire bonding of the first bonding wires 241. The bus bar 230 is also attached to the active surface 211 of the chip 210 between the first row of bonding pads 212 and the first fingers 221. Normally, the bus bar 230 is perpendicular to the first fingers 221. As shown in FIG. 5, the attached portion of the bus bar 230 attached to the chip 210 includes a bent section 231 bent away from the first fingers 221 so that the bent section 231 is shifted toward the first row of bonding pads 212 and away from the internal ends of the first leads 220 to increase the distance between the bent section 231 and the first fingers 221. To be more specific, the bent section 231 is horizontally extended to and is parallel to the active surface 211 of the chip 210. In the present embodiment, as shown in FIG. 4, the bent section 231 is in a shape similar to the bus bar 230 with a smaller size.

As shown in FIG. 4, the leadframe 20 further comprises a plurality of second leads 250 at the other side with respect to the first leads 220. Each second lead 250 has a second finger 251. The second leads 250 are attached to the active surface 211 of the chip 210 in a manner that the second fingers 251 are located over the active surface 211 and adjacent to the second row of bonding pads 213. In the present embodiment, as shown in FIG. 3, the external leads of the second leads 250 without encapsulating by the encapsulant 270 are disposed at the opposing side of the semiconductor package 200 with respect to the external leads of the first leads 220. As shown in FIG. 5, the internal leads of the second leads 250 encapsulated inside the encapsulant 270 are extended onto the active surface 211 of the chip 210. As shown in FIG. 4 again, the leadframe 20 is implemented in LOC packaging without die pads where the first leads 220, the second leads 250, and the bus bar 230 are attached to the active surface 211 of the chip 210 by a die-attaching material 260 such as P1 die-attaching tape or B-stage die-attaching paste. The die-attaching material 260 does not cover the first row of bonding pads 212 nor the second row of bonding pads 213. In the present embodiment, as shown in FIG. 4, the leadframe 20 further comprises a plurality of turbulent plates 280 disposed at both sides of the chip 210 and connected to both ends of the bus bar 230 to firmly hold the bus bar and to balance the mold flow above and below the chip 210. Preferably, as shown in FIG. 5, the bus bar 230 is connected to one of the first leads 220 in a shape similar to a "I" to enhance the strength of the bus bar 230 and to form an external lead of power or ground.

As shown in FIG. 3, the chip 210 is electrically connected to the first leads 220 by the first bonding wires 241 connecting from the first row of bonding pads 212, overpassing the bus bar 230, to the First fingers 221. Normally the bus bar 230 except the bent section 231 is located at the middle between the first row of bonding pads 212 and the first fingers 221 so that the first bonding wires 241 have safe heights above the bus bar 230. Accordingly, the first bonding wires 241 do not electrically short with the bus bar 230. Furthermore, the semiconductor package 200 further comprises a plurality of second bonding wires 242 electrically connecting the chip 210 to the second leads 250 by connecting from the second row of bonding pads 213, overpassing the bus bar 230A, to the second fingers 251.

Figure 6:
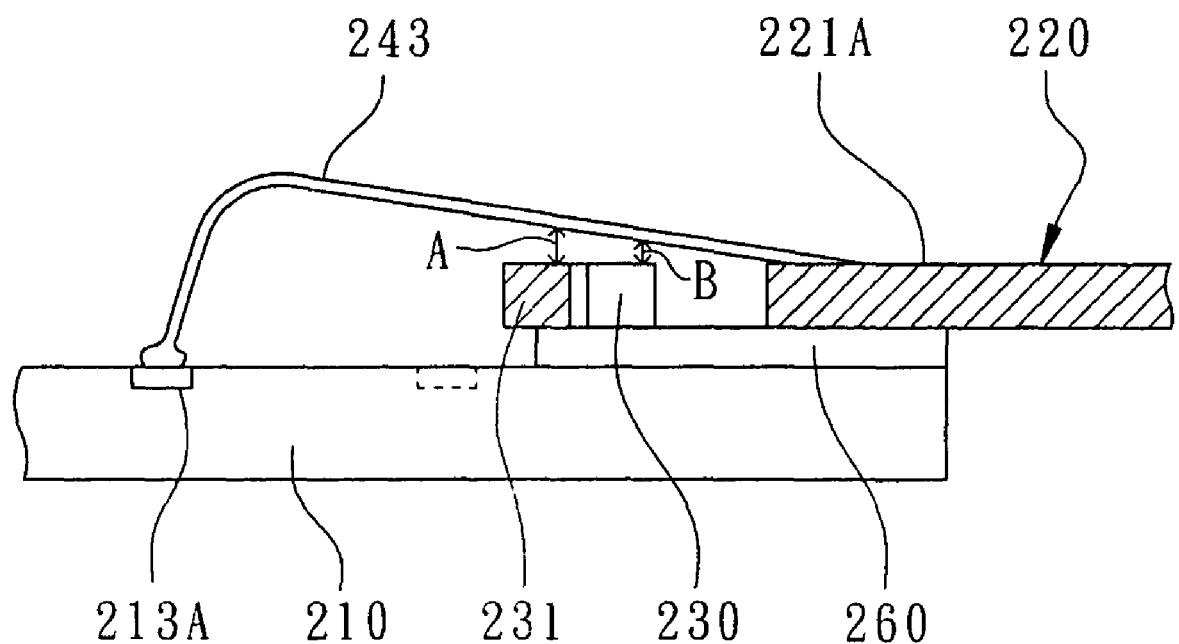
FIG. 6 shows the cross-sectional view of the semiconductor package along the 6-6 cross-sectional line in FIG. 5 according to the preferred embodiment of the present invention.

As shown in FIG. 5 and FIG. 6, the long bonding wire 243 connects one of the second row of bonding pads 213, i.e., numbered as 213A, to one of the first fingers 221, i.e., numbered as 221A, by overpassing at least a row (the first row) of bonding pads of the chip 210 and the bent section 231 of the bus bar 230 for wire bonding. The long bonding wire 243 is defined due to its wire bonding length is greater than the average wire length of the first bonding wires 241. The bent section 231 of the bus bar 230 is bent away from the first finger 221A to increase the distance between the bent section 231 and the first finger 221A. As shown in FIG. 6, the vertical height A between the long bonding wire 243 and the bent section 231 of the bus bar 230 is greater than the vertical height B between the long bonding wire 243 and the bus bar 230 so that the electrical short between the long bonding wire 243 and the bus bar 230 is avoided due to the wire sweep of the long bonding wire 243 during molding. The electrical quality of the semiconductor package 200 is greatly enhanced. In this embodiment, as shown in FIG. 5 again, the one 221A of the first fingers 221 connected by the long bonding wire 243 is adjacent the another one of the first fingers 221 integrally connecting the bus bar 230.

As shown in FIG. 5, preferably, the chip 210 has a non-pad open area 214 disposed between the first row of bonding pads 212 where there is no pad interposed between the non-pad open area 214. The length of the non-bonding pad open area 214 is greater than the average pad spacing of the first row of bonding pads 212. Additionally, the bent section 231 of the bus bar 230 is overlapped on the non-pad open area 214 as close to the central line of the active surface 211 of the chip 210 as possible.

As shown in FIG. 5, the semiconductor package 200 further comprises a first short bonding wire 244 to electrically connect one of the first row of bonding pads 212, i.e., numbered as 212B, to the bus bar 230. The first short bonding wire 244 is defined due to its wire length is shorter than the average wire length of the first bonding wires 241. In the present embodiment, the semiconductor package 200 further comprises a second short bonding wire 245 electrically connecting one of the second row of bonding pads 213, i.e., numbered as 213B, to another bus bar 230A. The first bonding wires 241, the second bonding wires 242, the long bonding wire 243, the first short bonding wire 244, and the second short bonding wire 245 are formed by wire bonding. To be more specific, the semiconductor package 200 further comprises an encapsulant 270 to encapsulate the chip 210, the internal leads of the first leads 220 including the first fingers 221, the internal leads of the second leads 250 including the second fingers 251, and all the bonding wires 241, 242, 243, 244, and 245 to avoid external contaminations.

As shown in FIG. 5 and FIG. 6, the bent section 231 is bent toward the bonding pads of the chip 210 to increase the distance between the bus bar 230 under the long bonding wire 243 and the first finger 221A, i.e., the height between the bent section 231 of the bus bar 230 and the long bonding wire 243 is increased to avoid electrical short between the bent section 231 of the bus bar 230 and the long bonding wire 243. Even if the long bonding wire 243 is wire sweep during molding of the encapsulant 270, the long bonding wire 243 will not electrically short to the bent section 231 of the bus bar 230. Therefore, in the present invention, a LOC leadframe-based semiconductor package 200 is provided for packaging a chip with multiple rows of bonding pads without suffering from packaging yield lost nor productivity drop.

The above description of embodiments of this invention is intended to be illustrative and not limiting. Other embodiments of this invention will be obvious to those skilled in the art in view of the above disclosure.

What is claimed is:

1. A semiconductor package primarily comprising:

a chip having an active surface with a first row of bonding pads and a second row of bonding pads disposed on the active surface in parallel;

a leadframe including a plurality of first leads and at least a bus bar, wherein each first lead has a first finger, the first leads are attached to the active surface of the chip in a manner that the first fingers are located above the active surface and adjacent to the first row of bonding pads, wherein the bus bar is also attached to the active surface of the chip and is disposed between the first row of bonding pads and the first to fingers, wherein the attached portion of the bus bar on the active surface includes a bent section bent away from one of the first fingers;

a plurality of first bonding wires electrically connecting the first row of bonding pads to the first fingers; and at least a long bonding wire electrically connecting one of the second row of bonding pads to the one of the first fingers by overpassing the bent section of the bus bar;

wherein the chip has a non-pad open area interposed into the first row of bonding pads, wherein the length of the non-pad open area is greater than the average spacing of the first row of bonding pads, and wherein the bent section is overlapped on the open area.

2. The semiconductor package as claimed in claim 1, further comprising a short bonding wire electrically connecting one of the first row of bonding pads to the bus bar.

3. The semiconductor package as claimed in claim 2, wherein one end of the short bonding wire connecting the bus bar is located at one end of the bent section.

4. The semiconductor package as claimed in claim 1, wherein the leadframe further includes a plurality of second leads each having a second finger, and wherein the second leads are attached to the active surface of the chip in a manner that the second fingers are located above the active surface and adjacent to the second row of bonding pads.

5. The semiconductor package as claimed in claim 4, further comprising a plurality of second bonding wires electrically connecting the second row of bonding pads to the second fingers.

6. The semiconductor package as claimed in claim 5, further comprising a short bonding wire electrically connecting one of the second row of bonding pads to the bus bar.

7. The semiconductor package as claimed in claim 1, wherein the leadframe further includes a plurality of turbulent plates disposed at two opposing sides of the chip, and wherein both ends of the bus bar are connected to the turbulent plates.

8. The semiconductor package as claimed in claim 1, wherein the bus bar is connected with another one of the first leads adjacent the one of the first fingers connected by the long bonding wire.

* * * * *